(12) United States Patent
Talledo (10) Patent No.: US 9,947,636 B2
(45) Date of Patent: Apr. 17, 2018

(54) METHOD FOR MAKING SEMICONDUCTOR DEVICE WITH LEAD FRAME MADE FROM TOP AND BOTTOM COMPONENTS AND RELATED DEVICES (71) Applicant: STMICROELECTRONICS, INC., Calamba, Laguna (PH)

(72) Inventor: Jefferson Talledo, Laguna (PH)

(73) Assignee: STMICROELECTRONICS, INC., Calamba, Laguna (PH)

( * ) Notice: Subject to any disclaimer, the term of this patent is extended or adjusted under 35 U.S.C. 154(b) by 92 days.

(21) Appl. No.: 14/293,274

(22) Filed: Jun. 2, 2014

(65) Prior Publication Data
US 2015/0348891 A1 Dec. 3, 2015

(51) Int. Cl.
*H01L 23/495* (2006.01)
*H01L 23/31* (2006.01)
*H01L 21/48* (2006.01)
*H01L 23/00* (2006.01)
*H01L 21/56* (2006.01)

(52) U.S. Cl.
CPC .......... *H01L 24/49* (2013.01); *H01L 21/4832* (2013.01); *H01L 21/568* (2013.01); *H01L 23/3107* (2013.01); *H01L 23/49548* (2013.01); *H01L 23/49582* (2013.01); *H01L 24/32* (2013.01); *H01L 24/48* (2013.01); *H01L 24/83* (2013.01); *H01L 24/85* (2013.01); *H01L 2224/32245* (2013.01); *H01L 2224/48096* (2013.01); *H01L 2224/48097* (2013.01); *H01L 2224/48245* (2013.01); *H01L 2224/48247* (2013.01); *H01L 2224/73265* (2013.01); *H01L 2224/8385* (2013.01); *H01L 2224/83424* (2013.01); *H01L 2224/83447* (2013.01); *H01L 2224/85424* (2013.01); *H01L 2224/85447* (2013.01); *H01L 2224/92247* (2013.01); *H01L 2924/00014* (2013.01); *H01L 2924/01013* (2013.01); *H01L 2924/01029* (2013.01); *H01L 2924/14* (2013.01); *H01L 2924/181* (2013.01); *H01L 2924/2064* (2013.01)

(58) Field of Classification Search
CPC .......... H01L 23/49548; H01L 23/3107; H01L 23/49582; H01L 21/4832
See application file for complete search history.

(56) References Cited

U.S. PATENT DOCUMENTS

| 5,383,094 A | 1/1995 | Estes |
| 5,656,550 A * | 8/1997 | Tsuji ..................... H01L 21/565 257/786 |
| 5,977,565 A | 11/1999 | Ishikawa et al. |
| 6,222,967 B1 | 4/2001 | Amano et al. |
| 6,238,952 B1 * | 5/2001 | Lin ..................... H01L 21/4821 257/E23.046 |

(Continued)

*Primary Examiner* — Zandra Smith
*Assistant Examiner* — Abbigale Boyle
(74) *Attorney, Agent, or Firm* — Slater Matsil, LLP (57) ABSTRACT

A method for making a semiconductor device may include bonding a top lead frame component, having recesses, with a bottom lead frame component to form a lead frame, the top and bottom lead frame components each including metal. The method may include mounting an IC on the lead frame, encapsulating the IC and the lead frame, and removing portions of the bottom lead frame component to define contacts for the IC.

37 Claims, 4 Drawing Sheets

(56) References Cited

U.S. PATENT DOCUMENTS

| | | | | |
|---|---|---|---|---|
| 6,451,627 | B1 * | 9/2002 | Coffman | H01L 21/4832 |
| | | | | 257/E23.054 |
| 6,946,324 | B1 * | 9/2005 | McLellan | H01L 21/4832 |
| | | | | 257/666 |
| 7,205,653 | B2 | 4/2007 | Brandenburg et al. | |
| 7,298,026 | B2 * | 11/2007 | Shim | H01L 21/565 |
| | | | | 257/666 |
| 7,485,957 | B2 | 2/2009 | Brandenburg et al. | |
| 8,026,597 | B2 | 9/2011 | Brandenburg et al. | |
| 8,471,380 | B2 | 6/2013 | Bradenburg et al. | |
| 2002/0089053 | A1 * | 7/2002 | Liu | H01L 21/4832 |
| | | | | 257/690 |
| 2005/0139982 | A1 * | 6/2005 | Fukaya | H01L 21/565 |
| | | | | 257/690 |
| 2005/0153483 | A1 * | 7/2005 | Groenhuis | H01L 21/4828 |
| | | | | 438/124 |
| 2007/0052076 | A1 * | 3/2007 | Ramos | H01L 21/4832 |
| | | | | 257/676 |
| 2009/0079050 | A1 * | 3/2009 | Steenbruggen | H01L 23/315 |
| | | | | 257/676 |
| 2010/0006992 | A1 * | 1/2010 | Dirks | H01L 23/3107 |
| | | | | 257/676 |
| 2012/0074548 | A1 * | 3/2012 | Camacho | H01L 21/4832 |
| | | | | 257/676 |

\* cited by examiner

METHOD FOR MAKING SEMICONDUCTOR DEVICE WITH LEAD FRAME MADE FROM TOP AND BOTTOM COMPONENTS AND RELATED DEVICES

TECHNICAL FIELD

The present disclosure relates to the field of semiconductor processing, and, more particularly, to a method for making a semiconductor device.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via bond wires or solder bumps.

One approach to IC packaging comprises a quad-flat no-leads (QFN) package. The QFN package may provide some advantages, such as reduced lead inductance, a near chip scale footprint, thin profile, and low weight. Also, the QFN package typically includes perimeter I/O pads to ease circuit board trace routing, and the exposed copper die-pad technology offers enhanced thermal and electrical performance. QFN packaging may be well suited for applications where size, weight, and thermal and electrical performance are important.

Figure 1A:
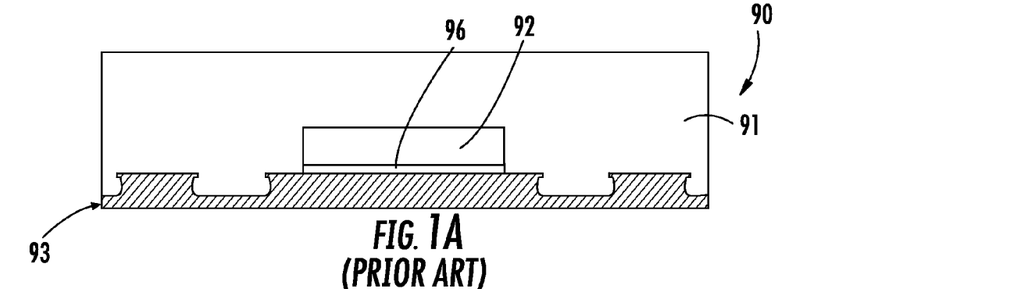
FIGS. 1A and 1B are schematic diagrams of sectional views of steps for making a semiconductor device, according to the prior art.
Figure 1B:
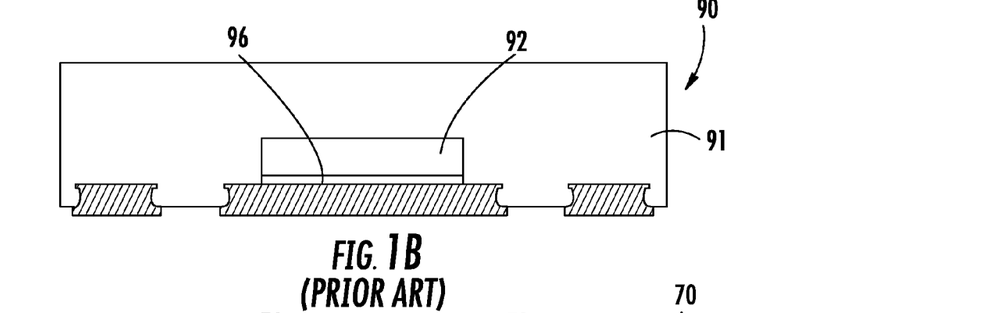

Referring initially to FIGS. 1A-1B, a typical QFN packaged electronic device 90 is now described. The electronic device 90 includes a lead frame 93, an IC 92 on the lead frame, an adhesive layer 96 between the lead frame and the IC, and encapsulation material 91 surrounding the IC and the lead frame. From FIG. 1A to FIG. 1B, a bottom layer of the lead frame 93 is removed to define contacts for the IC 92. A potential drawback to this approach is that the anchoring of the lead frame 93 to the encapsulation material 91 may not be sufficient.

Figure 2A:
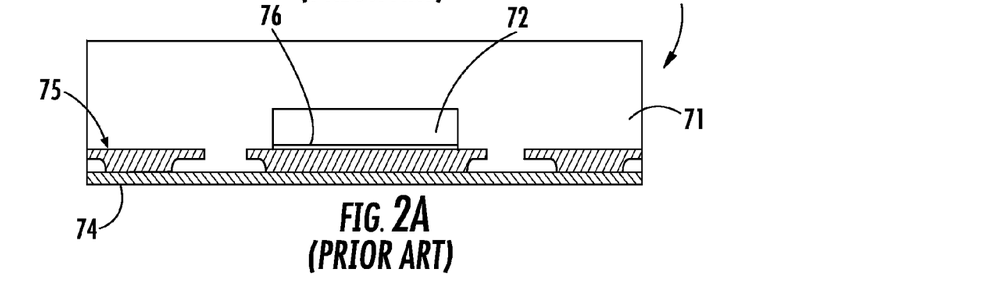
FIGS. 2A and 2B are schematic diagrams of sectional views of steps for making another semiconductor device, according to the prior art.
Figure 2B:
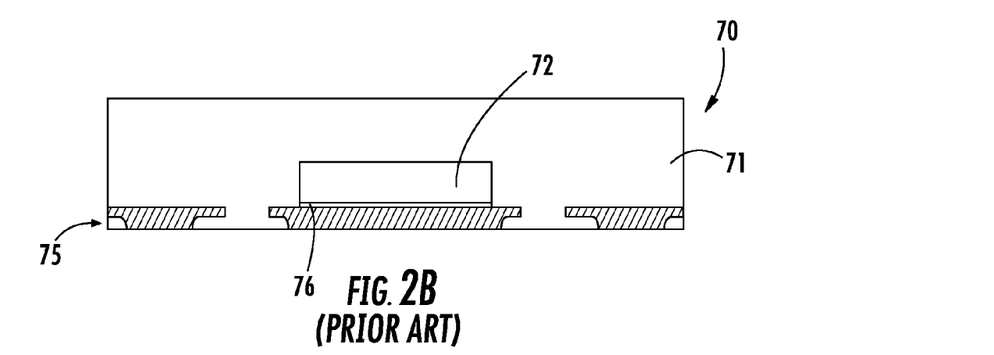

Referring now to FIGS. 2A-2B, a typical QFN/dual-flat no-leads (DFN) packaged electronic device 70 is now described. The electronic device 70 includes a lead frame 75, an IC 72 on the lead frame, an adhesive layer 76 between the lead frame and the IC, an adhesive tape layer 74 carrying the lead frame, and encapsulation material 71 surrounding the IC and the lead frame. From FIG. 2A to FIG. 2B, the adhesive tape layer 74 is removed to define contacts for the IC 72. A potential drawback to this approach is that the adhesive residue from the adhesive tape layer 74 remains on the contacts. Also, there may be mold flash issues from the encapsulation material 71 and lead/pad instability.

SUMMARY

Generally speaking, a method for making a semiconductor device may include bonding a top lead frame component, having a plurality of recesses therein, with a bottom lead frame component to form a lead frame. The top and bottom lead frame components may each comprise metal. For example, the metal may comprise copper. The method may include mounting at least one IC on the lead frame, encapsulating the at least one IC and the lead frame, and removing portions of the bottom lead frame component to define a plurality of contacts for the at least one IC.

In particular, the method may further comprise forming the top lead frame component so that each of the plurality of recesses defines mold anchoring tabs extending inwardly at an upper region thereof. The forming of the top lead frame component may comprise partial etching to define the plurality of recesses. Each of the plurality of recesses may extend through the top lead frame component.

Additionally, the bonding may comprise bonding the top and bottom lead frame components together without an adhesive. The bonding may comprise at least one of hot rolling and press bonding. The removing of the bottom lead frame component may comprise etching so that each contact extends past the encapsulation material.

Another aspect is directed to a method for making an electronic device. The method may include forming at least semiconductor device comprising bonding a top lead frame component, having a plurality of recesses therein, with a bottom lead frame component to form a lead frame. The top and bottom lead frame components may each comprise metal. The forming of the at least semiconductor device may comprise mounting at least one IC on the lead frame, encapsulating the at least one IC and the lead frame, and removing portions of the bottom lead frame component to define a plurality of contacts for the at least one IC. The method may include mounting the at least one semiconductor device on a printed circuit board.

Another aspect is directed to a semiconductor device. The semiconductor device may include at least one IC, an IC die pad aligned with the at least one IC, and a plurality of lead frame contacts adjacent the IC die pad, each lead frame contact having mold anchoring tabs extending inwardly at an upper region thereof. The semiconductor device may include a plurality of bond wires, each bond wire coupling a respective lead frame contact with the at least one IC, and encapsulation material surrounding the at least one IC, the plurality of lead frame contacts, and the plurality of bond wires, each lead frame contact protruding outwardly past adjacent portions of the encapsulation material.

DETAILED DESCRIPTION

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 3:
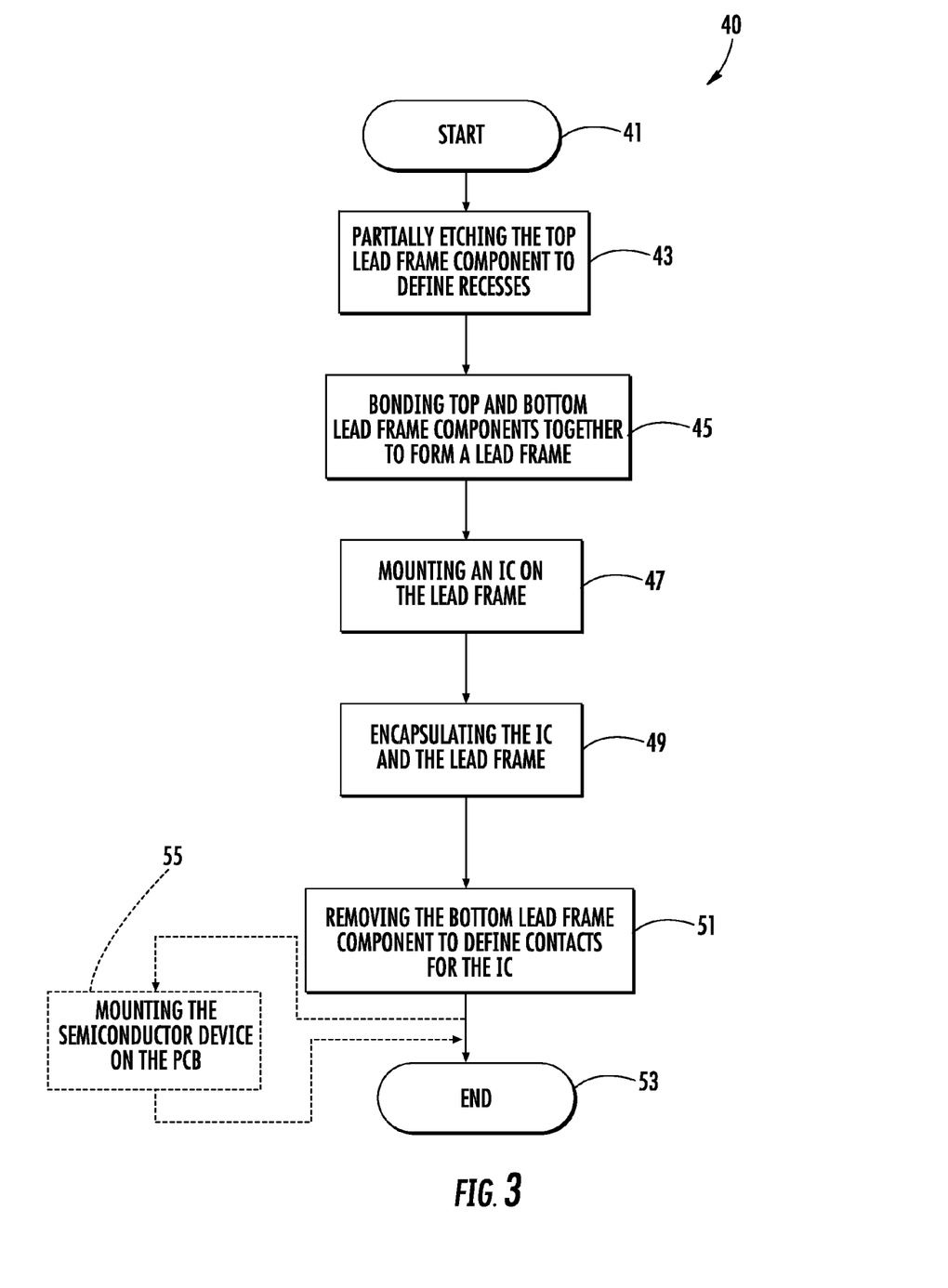
FIG. 3 is a flowchart illustrating a method for making a semiconductor device, according to the present disclosure.
Figure 4A:
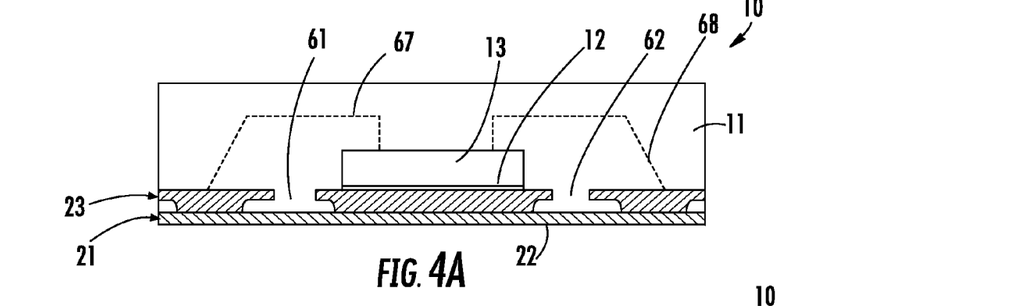
FIGS. 4A and 4B are schematic diagrams of sectional views of steps for making a semiconductor device, according to the present disclosure.
Figure 4B:
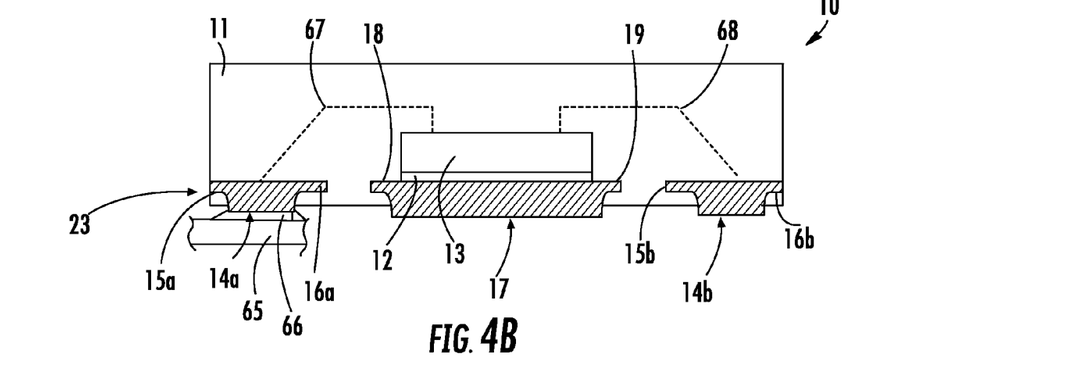
Figure 5:
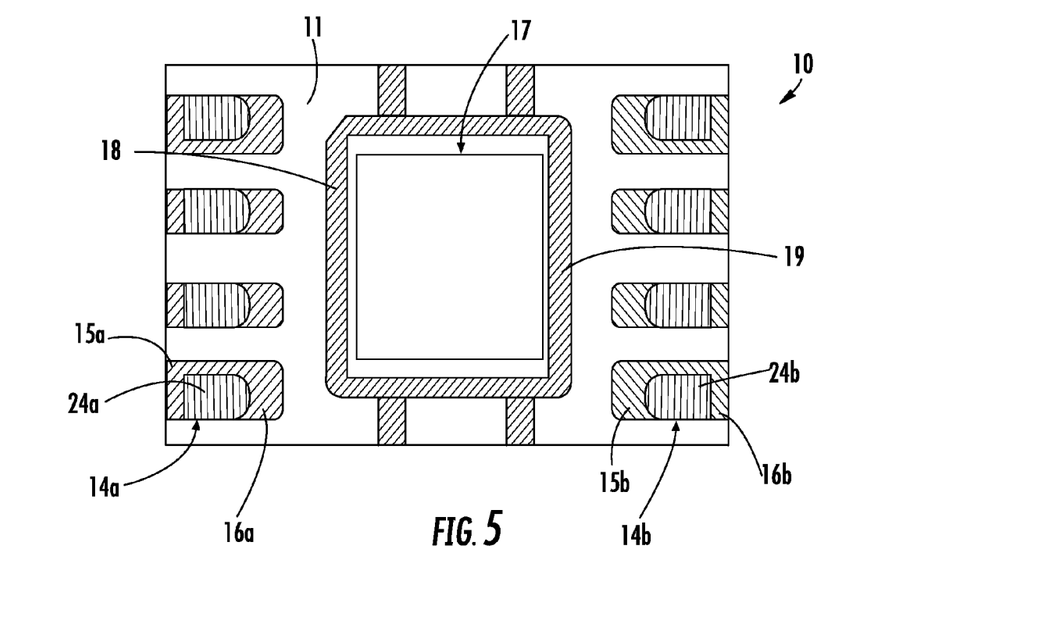
FIG. 5 is a schematic diagram of a bottom plan view of a semiconductor device, according to the present disclosure.

Referring now to FIGS. 3-5, a semiconductor device 10 and a method for making the semiconductor device, according to the present disclosure, are now described. In a flowchart 40, the method for making the semiconductor device 10 begins at Block 41. The method illustratively includes forming a top lead frame component 23 having a plurality of recesses 61-62 therein. The forming of the top lead frame component 23 may comprise partial etching to define the plurality of recesses 61-62. In some embodiments, the partial etching or half etching step may comprise etching a lead frame to a certain depth that is less than the full thickness of the lead frame to provide mold locking features. In particular, the method further comprises forming the top lead frame component 23 so that each of the plurality of recesses 61-62 defines mold anchoring tabs 15a-16b extending inwardly at an upper region thereof. (Block 43). Each of the plurality of recesses 61-62 illustratively extends through the top lead frame component 23.

The method illustratively includes bonding the top lead frame component 23 with a bottom lead frame component 21 to form a lead frame. (Block 45). Additionally, the bonding may comprise bonding the top and bottom lead frame components 23, 21 together without an adhesive. Advantageously, this may address the adhesive residue issue in the prior art.

In the illustrated embodiment, the top and bottom lead frame components 23, 21 each comprises metal, in some embodiments the same metal, but in other embodiments different metals. For example, the metal may comprise copper or aluminum.

The method illustratively includes mounting an IC 13 on the lead frame. (Block 47). In some embodiments, the mounting may be performed using a pick-and-place (PnP) machine. In the illustrated embodiment, the method includes forming an adhesive layer 12 between the top lead frame component 23 and the IC 13. The IC 13 is seated onto the adhesive layer 12. The method illustratively includes forming a plurality of bond wires 67-68 for coupling the IC 13 and the top lead frame component 23.

The method illustratively includes encapsulating the IC 13 and the lead frame with encapsulating material 11. (Block 49). For example, the encapsulating material 11 may comprise an electrically insulating resin.

The method illustratively includes removing portions of the bottom lead frame component 21 to define a plurality of contacts 24a-24b for the IC 13. (Blocks 51, 53). As perhaps best seen in FIG. 4B, the removing of the bottom lead frame component 21 may comprise etching so that each contact 24a-24b extends or protrudes past the encapsulation material 11. Advantageously, each contact 24a-24b has improved standoff from the encapsulation material 11.

Once the portions of bottom lead frame component 21 is removed, the top lead frame component 23 comprises a plurality of electrically insulated T-shaped columns 14a-14b extending vertically and positioned radially around the IC 13. The top portions of the T-shaped columns 14a-14b extend laterally into the encapsulation material 11 to define the mold anchoring tabs 15a-16b. Each T-shaped column 14a-14b extends laterally past an exposed surface of the respective contact 24a-24b. This may advantageously provide mechanically robust encapsulation material 11 anchoring. Each mold anchoring tab 15a-16b has a curved sidewall, a lowermost region, and an upper region extending laterally inwardly into the encapsulation material 11 and beyond the lowermost region, the curved sidewall extending between the lowermost region and the upper region.

The top lead frame component 23 comprises an IC die pad (also serving as a thermal heat sink) 17 that is centrally positioned and aligned with the IC 13. The IC die pad 17 also illustratively has a T-shaped column shape. Additionally, the top portion of the T-shaped column extends laterally into the encapsulation material 11 to define the mold anchoring tabs 18-19.

As perhaps best seen in FIG. 5, the semiconductor device 10 illustratively includes the contacts 24a-24b that are of the land grid array type, but other types may be used in other embodiments. Advantageously, the semiconductor device 10 may eliminate the tape residue issue, the mold flash issue, and the lead instability issue during wire bonding with taped lead frame packages (e.g. taped QFN, DEN). The semiconductor device 10 may improve mold anchoring and package robustness over tapeless lead frame packages (e.g. tapeless QFN, DEN, QFNmr). The semiconductor device 10 may provide combined positive features of taped lead frame packages and tapeless lead frame packages.

Moreover, the semiconductor device 10 addresses several issues with the prior art devices of FIGS. 1A-2B. The semiconductor device 10 may provide an approach to the problem of insufficient mold anchoring and package robustness (for tapeless QFN/DFN/QFNmr). For example, pulled out leads were some of the issues encountered due to insufficient mold anchoring (e.g. DFN8). It has been noted that package breaking strength may also be lower when there is no half etch structural reinforcement, as in the disclosed embodiments.

The semiconductor device 10 may provide an approach to the problem of lead/pad instability, non-stick on lead, and non-stick on pad (NSOL)/(NSOP) during wire bonding (for taped QFN/DFN), especially when involving smaller leads/pads. For taped QFN/DFN, lead/pad instability is a common problem, especially with smaller leads/pads. This is due to the bottom of the lead or pad being held onto the tape only, which would not have good adhesion/support when lead contact area gets smaller and would not be able to sufficiently resist the tendency of the leads to be toppled during wire bonding.

The semiconductor device 10 may provide an approach to the problem of tape residue when bonding multiple wires on a single lead (for tape QFN/DFN). With taped QFN/DFN, bonding multiple wires on a single lead is known to be prone to the tape residue issue. Mold flash is also addressed (for tape QFN/DFN) by the semiconductor device 10. Mold flash is also a common problem with tape QFN/DFN, especially when tape adhesion is not good, such as when leads are smaller.

Another aspect is directed to a method for making an electronic device. The method may include forming at least semiconductor device 10 comprising bonding a top lead frame component 23, having a plurality of recesses 61, 62 therein, with a bottom lead frame component 21 to form a lead frame, the top and bottom lead frame components each comprising metal. The forming of the at least semiconductor device 10 may comprise mounting at least one IC 13 on the lead frame, encapsulating the at least one IC and the lead frame, and removing portions of the bottom lead frame component 21 to define a plurality of contacts 24a-24b for the at least one IC. The method may include mounting the at least one semiconductor device 10 on a printed circuit board 65 via a plurality of solder joints 66 (Block 55: FIG. 3).

Figure 6A:
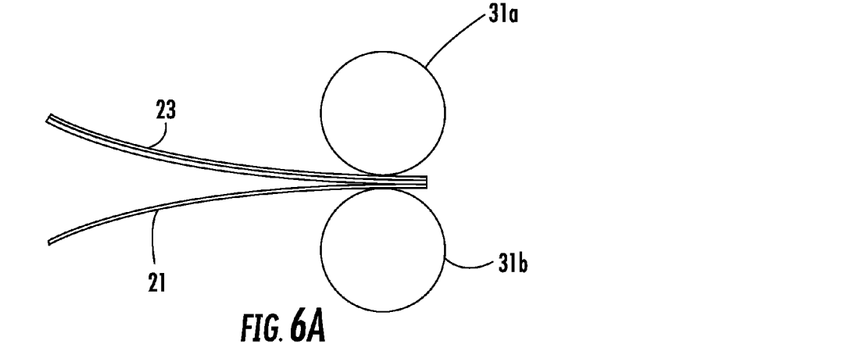
FIGS. 6A and 6B are schematic diagrams of a side view and an enlarged side view, respectively, of a step from the method of making the semiconductor device, according to the present disclosure.
Figure 6B:
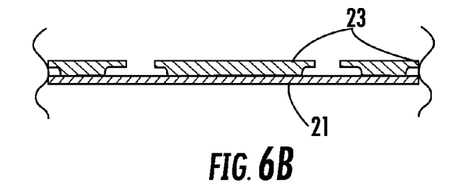
Figure 7:
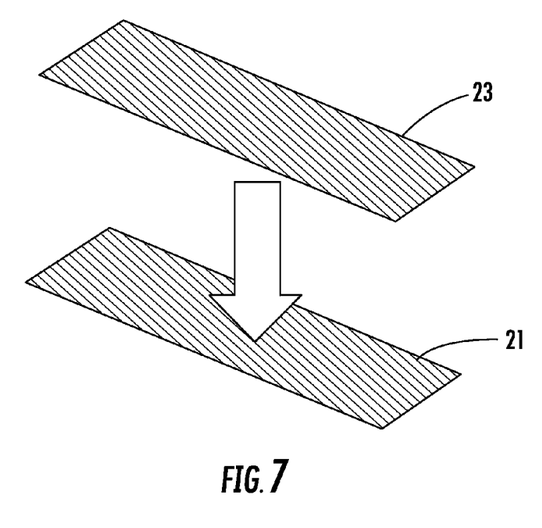
FIG. 7 is a schematic diagram of a perspective view of a step from another embodiment of the method of making the semiconductor device, according to the present disclosure.

Referring now additionally to FIGS. 6A-7, embodiments of the step for the bonding of the top lead frame component 23 with the bottom lead frame component 21 are now described. In FIGS. 6A and 6B, the top lead frame component 23 and the bottom lead frame component 21 are hot rolled together via a pair of rollers 31a-31b. In FIG. 7, the top lead frame component 23 and the bottom lead frame component 21 are press bonded together. As will be appreciated, each of these embodiments provides for the manufacture of a plurality of semiconductor devices 10 at the same time. These wafer level type processing embodiments would also include a singulating step.

In other embodiments, the top lead frame component 23 and the bottom lead frame component 21 are diffusion bonded together. In embodiments using copper material, the top lead frame component 23 and the bottom lead frame component 21 are cladded together. The copper cladding forms a metallurgical bond with the top lead frame component 23 having half etch anchoring. This copper cladding provides stable and robust base for leads during wire bonding to avoid NSOL/NSOP issue, especially for smaller leads and still have the good mold anchoring and structural reinforcement of half etch lead frame.

Another aspect is directed to a semiconductor device 10 comprising an IC 13, an IC die pad 17 aligned with the IC, and a plurality of lead frame contacts 24a-24b adjacent the IC die pad, each lead frame contact having mold anchoring tabs 15a-16b extending inwardly at an upper region thereof. The semiconductor device 10 illustratively includes a plurality of bond wires 67-68, each bond wire coupling a respective lead frame contact 24a-24b with the IC 13, and encapsulation material 11 surrounding the IC, the plurality of lead frame contacts, and the plurality of bond wires, each lead frame contact protruding outwardly past adjacent portions of the encapsulation material.

In the illustrated embodiment, the IC die pad 17 comprises mold anchoring tabs extending 18-19 inwardly at an upper region thereof. The mold anchoring tabs 15a-16b of each lead frame contact 24a-24b comprise a first metal, and the portion of each lead frame contact that protrudes past the encapsulation material 11 comprises a second metal different from the first metal.

For example, each lead frame contact 24a-24b protrudes outwardly past adjacent portions of the encapsulation material 11 a distance of at least 50 microns. Each lead frame contact 24a-24b protrudes outwardly past adjacent portions of the encapsulation material 11 a distance of 45-55% (preferably 50%) of a thickness of each lead from contact.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A method for making a semiconductor device comprising:
    providing a top lead frame component having a first major surface and a second major surface opposite to the first major surface, the top lead frame component having a plurality of holes extending completely through the top lead frame component from the first major surface to the second major surface;
    directly bonding the top lead frame component with a bottom lead frame component to form a lead frame, the top and bottom lead frame components each comprising metal;
    mounting at least one integrated circuit (IC) on the lead frame;
    encapsulating, with encapsulation material, the at least one IC and the lead frame, wherein each of the plurality of holes defines mold anchoring tabs extending laterally inwardly at an upper region of the top lead frame component and into the encapsulation material, wherein the forming of the top lead frame component comprises etching to define the plurality of holes; and
    removing portions of the bottom lead frame component to define a plurality of contacts for the at least one IC.

2. The method of claim 1, wherein each of the plurality of holes extends through the top lead frame component.

3. The method of claim 1, wherein the bonding comprises bonding the top and bottom lead frame components together without an adhesive.

4. The method of claim 1, wherein the bonding comprises at least one of hot rolling and press bonding.

5. The method of claim 1, wherein the metal comprises copper.

6. The method of claim 1, wherein the removing of the bottom lead frame component comprises etching so that each contact extends past the encapsulation material.

7. A method for making a semiconductor device comprising:
    forming a top lead frame component to have a plurality of holes and with each hole defining mold anchoring tabs extending laterally inwardly at an upper region of the top lead frame component, the top lead frame component having a first major surface and a second major surface opposite to the first major surface, the plurality of holes extending completely through the top lead frame component from the first major surface to the second major surface;
    after the forming, directly bonding the top lead frame component with a bottom lead frame component to form a lead frame, the top and bottom lead frame components each comprising copper, the bottom lead frame component forming a bottom surface of the plurality of holes, the top lead frame component forming sidewalls of the plurality of holes, the top lead frame component physically contacting the bottom lead frame component;
    mounting at least one integrated circuit (IC) on the lead frame, the IC coupled to pads on a major surface of the top lead frame;
    encapsulating, with encapsulation material, the at least one IC and the lead frame, the mold anchoring tabs extending laterally inwardly into the encapsulation material; and
    removing portions of the bottom lead frame component to define a plurality of contacts for the at least one IC, the plurality of contacts extending vertically past a bottom surface of the encapsulation material.

8. The method of claim 7, wherein the forming of the top lead frame component comprises partial etching to define the plurality of holes.

9. The method of claim 7, wherein each of the plurality of holes extends through the top lead frame component.

10. The method of claim 7, wherein the bonding comprises bonding the top and bottom lead frame components together without an adhesive.

11. The method of claim 7, wherein the bonding comprises at least one of hot rolling and press bonding.

12. The method of claim 7, wherein the removing of the bottom lead frame component comprises etching so that each contact extends past the encapsulation material.

13. The method of claim 1, wherein each mold anchoring tab comprises:
  a curved sidewall;
  a lowermost region; and
  an upper region extending in a lateral direction into the encapsulation material, the curved sidewall extending between the lowermost region and the upper region, the lateral direction being parallel to a major surface of the top lead frame component, the upper region extending beyond the lowermost region along the lateral direction.

14. The method of claim 7, wherein each mold anchoring tab comprises:
  a curved sidewall;
  a lowermost region; and
  an upper region extending n a lateral direction into the encapsulation material, the curved sidewall extending between the lowermost region and the upper region, the lateral direction being parallel to a major surface of the top lead frame component, the upper region extending beyond the lowermost region along the lateral direction.

15. The method of claim 1, wherein the etching is performed before the direct bonding of the top lead frame component and the bottom lead frame component.

16. The method of claim 8, wherein the etching is performed before the direct bonding of the top lead frame component and the bottom lead frame component.

17. The method of claim 1, further comprising mounting the lead frame on a printed circuit board.

18. The method of claim 7, further comprising mounting the lead frame on a printed circuit board.

19. The method of claim 7, wherein the forming of the top lead frame component comprises partial etching to define the plurality of holes.

20. A method for making a semiconductor device comprising:
  providing a top lead frame component and a bottom lead frame component physically separate from the top lead frame component;
  forming through holes in the top lead frame component, wherein each of the through holes comprises a first sidewall, an opposite second sidewall;
  after forming the through holes, attaching the top lead frame component with the bottom lead frame component to form a lead frame, the bottom lead frame component forming a bottom surface of the through holes after the attaching;
  mounting an integrated circuit (IC) on the lead frame;
  encapsulating the IC and the lead frame, the encapsulating completely filling the through holes with an encapsulant material; and
  removing portions of the bottom lead frame component to form contacts of the lead frame for the IC, wherein the removing is stopped after removing the bottom surface of the through holes to expose the encapsulant material.

21. The method of claim 20, wherein the through holes comprise a first opening size at a first surface, wherein the through holes comprise a second opening size at the bottom surface, wherein the first opening size is smaller than the second opening size.

22. The method of claim 20, wherein the attaching the top lead frame component with the bottom lead frame component comprises bonding the top and bottom lead frame components together without an adhesive.

23. The method of claim 20, wherein the attaching the top lead frame component with the bottom lead frame component comprises at least one of hot rolling and press bonding.

24. The method of claim 20, wherein the attaching the top lead frame component with the bottom lead frame component comprises diffusion bonding.

25. The method of claim 20, wherein the removing of the bottom lead frame component comprises etching so that each contact extends past the encapsulation material.

26. The method of claim 20, wherein the top lead frame component comprises copper and the bottom lead frame component comprises copper.

27. The method of claim 20, wherein the contacts of the lead frame comprise a first thickness in a central region of each of the contacts, wherein the contacts protrude out past the encapsulation material to a first distance from a major surface of the encapsulation material, wherein the first distance is 45-55% of the first thickness.

28. The method of claim 20, further comprising mounting the lead frame onto a printed circuit board.

29. A method for making a semiconductor device comprising:
  providing a top lead frame component and a bottom lead frame component physically separate from the top lead frame component;
  forming through holes in the top lead frame component, wherein each of the through holes comprises a first sidewall, an opposite second sidewall;
  after forming the through holes, attaching the top lead frame with the bottom lead frame component to form a lead frame, the bottom lead frame component forming a bottom surface of the through holes after the attaching;
  mounting an integrated circuit (IC) on the lead frame;
  encapsulating the IC and the lead frame, the encapsulating completely filling the through holes with an encapsulant material to form mold anchor points; and
  removing portions of the bottom lead frame to form T-shaped insulated columns supported by the mold anchor points, wherein the T-shaped insulated columns provide contacts to the lead frame, wherein, in a top sectional view parallel to a major surface of the IC, the IC is mounted onto one of the T-shaped columns, wherein the one of the T-shaped insulated columns comprises a first upper portion that extends past a corresponding exposed surface of the contacts away from the IC, wherein the remaining T-shaped insulated columns comprise an upper portion that extends past a corresponding exposed surface of the contacts towards the IC, wherein the removing is stopped after removing the bottom surface of the through holes to expose the encapsulant material.

30. The method of claim 29, wherein the through holes comprise a first opening size at a first surface, wherein the through holes comprise a second opening size at the bottom surface, wherein the first opening size is smaller than the second opening size.

31. The method of claim 29, wherein the attaching the top lead frame component with the bottom lead frame component comprises bonding the top and bottom lead frame components together without an adhesive.

32. The method of claim 29, wherein the attaching the top lead frame component with the bottom lead frame component comprises at least one of hot rolling and press bonding.

33. The method of claim 29, wherein the attaching the top lead frame component with the bottom lead frame component comprises diffusion bonding.

34. The method of claim 29, wherein the removing of the bottom lead frame component comprises etching so that each contact extends past the encapsulation material.

35. The method of claim 29, wherein the top lead frame component comprises copper and the bottom lead frame component comprises copper.

36. The method of claim 29, wherein the contacts of the lead frame comprise a first thickness in a central region of each of the contacts, wherein the contacts protrude out past the encapsulation material to a first distance from a major surface of the encapsulation material, wherein the first distance is 45-55% of the first thickness.

37. The method of claim 29, further comprising mounting the lead frame onto a printed circuit board.

\* \* \* \* \*